United States Patent
Eiriksson et al.

(10) Patent No.: US 7,560,705 B2
(45) Date of Patent: Jul. 14, 2009

(54) WORKPIECE HANDLING SCAN ARM FOR ION IMPLANTATION SYSTEM

(75) Inventors: Ari Eiriksson, Beverly, MA (US); Donovan Beckel, Wakefield, MA (US); Robert Mitchell, Winchester, MA (US); Michel Pharand, San Jose, CA (US); Marvin LaFontaine, Kingston, NH (US); Ashwin Purohit, Gloucester, MA (US); Steven Weed, Marblehead, MA (US); Wayne Arseneault, Lynnfield, MA (US); Shantanu Pathak, Nutley, NJ (US); Joseph Daniel Foley, Swampscott, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 120 days.

(21) Appl. No.: 11/840,888

(22) Filed: Aug. 17, 2007

(65) Prior Publication Data

US 2008/0105836 A1    May 8, 2008

Related U.S. Application Data

(60) Provisional application No. 60/838,407, filed on Aug. 17, 2006.

(51) Int. Cl.
 *H01J 37/317* (2006.01)
(52) U.S. Cl. .............................. 250/442.11; 250/492.21
(58) Field of Classification Search ............ 250/442.11, 250/492.21
See application file for complete search history.

(56) References Cited

U.S. PATENT DOCUMENTS

| 7,105,838 B2 * | 9/2006 | Naylor-Smith et al. . 250/492.21 |
| 7,135,691 B2 | 11/2006 | Vanderpot et al. |

\* cited by examiner

*Primary Examiner*—Kiet T Nguyen
(74) *Attorney, Agent, or Firm*—Eschweiler & Associates, LLC

(57) ABSTRACT

An ion implantation apparatus, system, and method are provided for connecting and disconnecting a workpiece holder from a scan arm. A twist head is provided, wherein an electrostatic chuck is operable to be mounted, wherein one or more rotating and non-rotating members associated with one or more of the twist head and electrostatic chuck have one or more dynamic electrical and fluid rotary connections associated therewith. The electrostatic chuck is further operable to be removed from the twist head without disconnecting the one or more dynamic fluid seals.

22 Claims, 9 Drawing Sheets

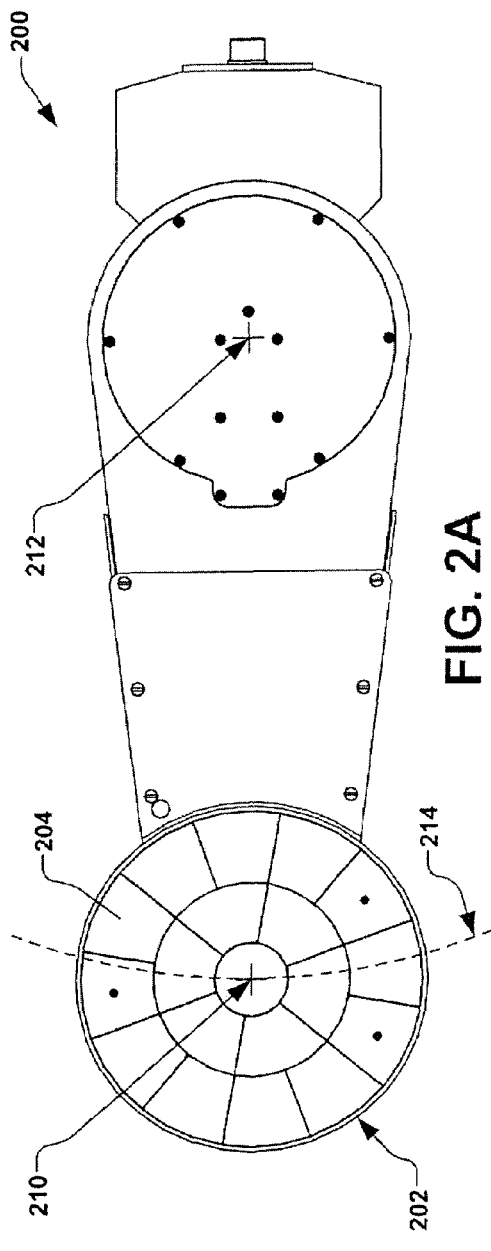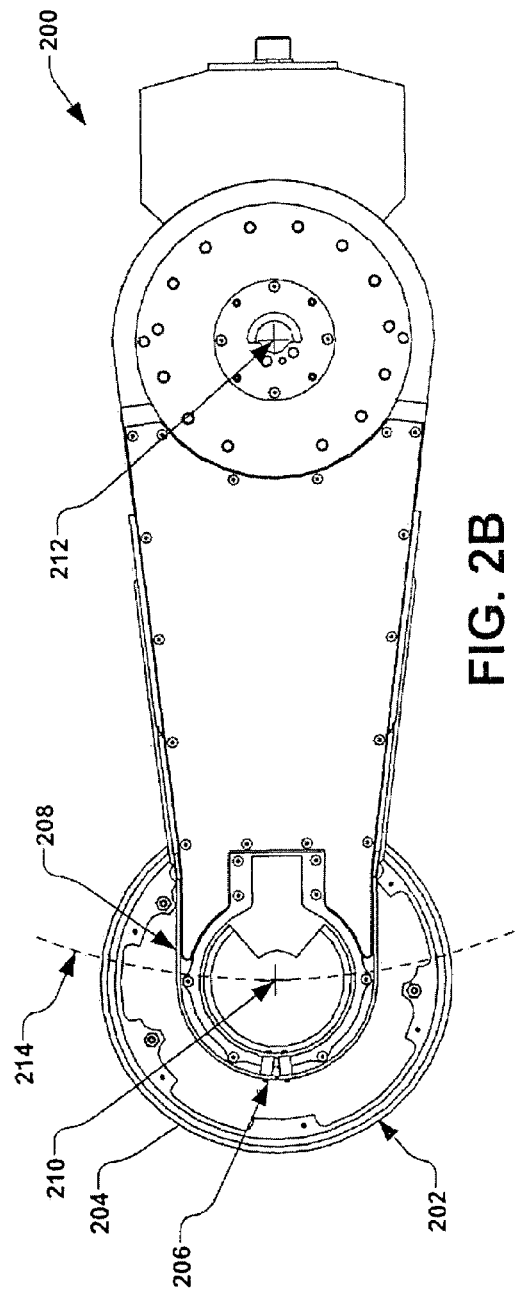

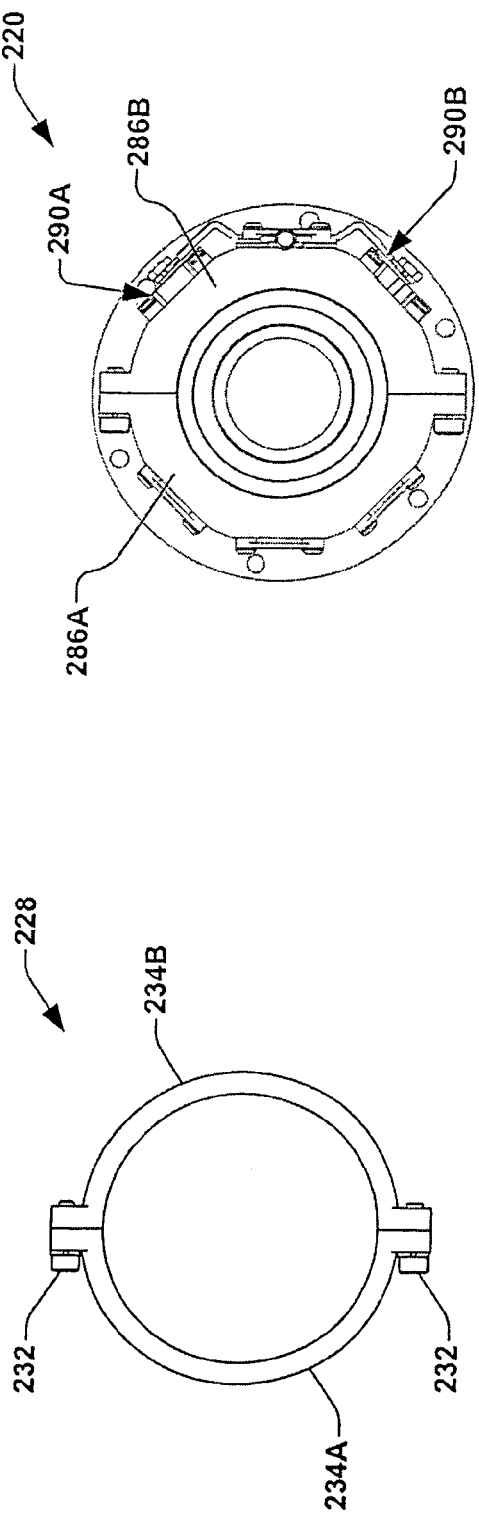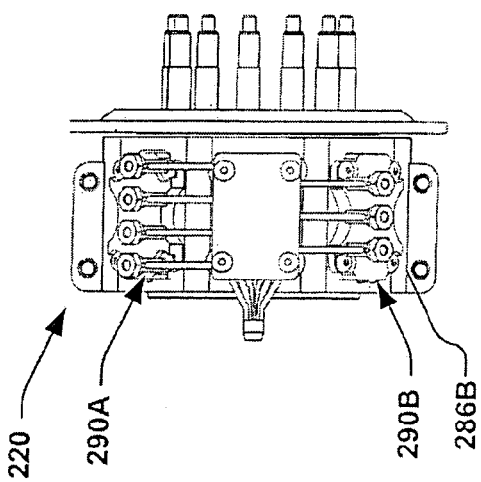

WORKPIECE HANDLING SCAN ARM FOR ION IMPLANTATION SYSTEM

REFERENCE TO RELATED APPLICATION

This application claims priority to and the benefit of U.S. Provisional Application Ser. No. 60/838,407 which was filed Aug. 17, 2006, entitled WORKPIECE HANDLING SCAN ARM FOR ION IMPLANTATION SYSTEM, the entirety of which is hereby incorporated by reference as if fully set forth herein.

FIELD OF THE INVENTION

The present invention relates generally to ion implantation systems and methods for implanting ions into a workpiece, and more specifically to a scan arm end effector for handling the workpiece.

BACKGROUND OF THE INVENTION

In the semiconductor industry, ion implantation systems are typically employed to dope a workpiece with impurities. In such systems, an ion source ionizes a desired dopant element, wherein ions are generally extracted from the ion source in the form of an undifferentiated ion beam. The undifferentiated ion beam is typically directed into a beamline assembly comprising a mass analysis apparatus or mass analyzer, wherein ions of a desired charge-to-mass ratio are selected using magnetic fields. Mass analyzers typically employ a mass analysis magnet (also called an AMU magnet) to create a dipole magnetic field, wherein various ions in an ion beam are deflected via magnetic deflection in an arcuate passageway that effectively separates ions of different charge-to-mass ratios. The mass of an ion relative to the charge thereon (i.e., the charge-to-mass ratio) affects the degree to which it is accelerated both axially and transversely by an electrostatic or magnetic field. Therefore, the selected or desired ion beam can be made very pure, since ions of undesirable molecular weight will be deflected to positions away from the beam. The process of selectively separating ions of desired and undesired charge-to-mass ratios is known as mass analysis.

The selected or desired ions are then directed at a surface of the workpiece positioned in a target chamber or end station, wherein the workpiece, (e.g., a semiconductor substrate or wafer) is generally implanted with the dopant element. Accordingly, the ions of the desired ion beam penetrate the surface of the workpiece to form a region having a desired characteristic, such as a desired electrical conductivity useful in the fabrication of transistor devices. The ions, for example, are embedded into a crystalline lattice of the workpiece material to form the region of desired conductivity, with the energy of the ion beam generally determining the depth of implantation.

The ion beam may be a spot beam (e.g., a pencil beam), wherein the workpiece is mechanically scanned in two dimensions that are generally orthogonal to the generally stationary spot beam; a ribbon beam, wherein the beam is electromagnetically scanned in one direction across the workpiece while the workpiece is mechanically scanned in an orthogonal direction; or an electromagnetically scanned beam that is electromagnetically scanned in two directions across a stationary workpiece. In a typical two-dimensional scan system, for example, a workpiece handling scan arm is associated with the end station(s) in order to translate the workpiece(s) inside a vacuum chamber of the end station. The scan arm typically scans an electrostatic chuck (ESC) that is holding the workpiece through the ion beam, wherein the ESC selectively clamps the workpiece thereto in order to maintain a position of the workpiece with respect to the ESC during processing (e.g., during ion implantation into the workpiece). Various ion implantation processes are designed such that the ESC and workpiece are further rotated about an axis defined perpendicular to the ESC/workpiece plane thru a center of the ESC/workpiece. Accordingly, conventional scan arms may be equipped with a twist head end effector which allows the ESC to be rotated relative to the scan arm.

Conventional twist head end effectors comprise various connections between the rotating and non-rotating components associated with the twist head, wherein the connections permit a rotation of the ESC with respect to the scan arm. The connections provide electrical and fluid coupling of the ESC to the scan arm, wherein electrical power is supplied to the ESC, as well as a provisions for coolant circulation, and, in some cases, conductive gases that are provided to the ESC. Typical twist head end effectors comprise dynamic fluid seals (e.g., sliding seals) for connecting fluid conduits directly to the ESC. Such dynamic fluid seals are typically prone to damage during disassembly and reassembly, and prior twist head end effectors do not typically allow replacement and/or servicing of the ESC or other twist head components without a disassembly of the dynamic fluid seals. Furthermore, typical electrical connections to the ESC comprise ribbon cables between the scan arm and ESC, wherein rotational movement of the ESC with respect to the scan arm is permitted, but limited by the length and/or configuration of the ribbon cables. Such ribbon cables are also prone to wear and may cause particle generation within the ion implantation system. Also, such ribbon cables are typically exposed to sputtering from the ion implantation process, and are exposed to the vacuum environment of the end station, thus leading to increased maintenance intervals.

Thus, it is desirable to provide an apparatus and method for an improved rotary end effector and ESC, wherein ease of removal and remounting of the ESC is significantly improved. It is further desirable that removal and remounting are made possible without disassembly of dynamic fluid seals, and that electrical connections are made such that the electrical connections are robust, are easily maintained, and substantially limit contamination seen in the prior art.

SUMMARY OF THE INVENTION

The present invention overcomes the limitations of the prior art by providing an apparatus and method for significantly improving the ease of removal and remounting of ESCs on an end effector, as well as increasing reliability and robustness of the end effector. The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

In accordance with one exemplary aspect of the present invention, a rotational end effector for a scan arm is provided, wherein the rotational end effector comprises an electrostatic chuck operably coupled to a scan arm for scanning a workpiece through and ion beam. The electrostatic chuck, for example, comprises a first mounting member, wherein the first mounting member has one or more first electrical connectors and one or more first fluid channels associated therewith.

A twist head is further provided, wherein the twist head is configured to selectively rotate the electrostatic chuck about a twist axis. The twist head, for example, comprises a generally fixed enclosure and a rotatable shaft rotatably coupled to the enclosure, wherein the rotatable shaft comprises a second mounting member. The rotatable shaft further has one or more second electrical connectors and one or more second fluid channels associated therewith.

A clamping member is also provided, wherein the clamping member is configured to selectively couple the first mounting member of the electrostatic chuck to the second mounting member of the rotatable shaft, wherein the one or more first electrical connectors and the one or more first fluid channels of the electrostatic chuck are selectively connected to the respective one or more second electrical connectors and one or more second fluid channels of the rotatable shaft by the clamping member. According to one exemplary aspect, the clamping member comprises a K-clamp.

According to another exemplary aspect of the invention, the rotatable shaft comprises one or more thru-holes associated therewith, wherein the one or more first electrical connectors comprise one or more electrostatic chuck connector pins. The twist head further comprises a rotary electrical connection module, wherein the one or more second electrical connectors comprise one or more rotary electrical connection module pins. The one or more electrostatic chuck connector pins and one or more electrical connection module pins are further operable to generally extend through one or more thru-holes and respectively mate with one another.

According to yet another exemplary aspect, the rotary electrical connection module comprises a rotating inner cylinder and a non-rotating enclosure selectably coupled to a motor. The rotary electrical connection module further comprises one or more slip rings operably coupled to the rotating inner cylinder, and wherein the one or more slip rings are configured to electrically connect to the one or more rotary electrical connection module pins.

In accordance with another exemplary aspect, the generally fixed enclosure further comprises a non-rotating fluid core having one or more third fluid channels associated therewith, wherein the non-rotating fluid core is fixed with respect to the generally fixed enclosure. One or more dynamic lip seals are further disposed at an interface between the one or more second fluid channels of the rotatable shaft and the one or more third fluid channels of the non-rotating fluid core.

According to yet another exemplary aspect, the twist head further comprises one or more flexible fluid lines in respective fluid communication with the one or more third fluid channels of the non-rotating fluid core and one or more fluid line blocks associated with the scan arm. A pair of rotation-limiting hard-stop brackets are further provided in the present example, wherein the pair of rotation-limiting hard-stop brackets generally defines a predetermined rotation of the non-rotating fluid core with respect to the scan arm, wherein the rotatable shaft is generally stationary relative to the dynamic lip seals within the predetermined rotation.

To the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 2A-2B illustrate respective top and bottom plan views of an exemplary scan arm according to another aspect of the invention.

FIG. 6 illustrates an exemplary K-clamp in accordance with yet another exemplary aspect of the invention.

FIGS. 7A-7B illustrate an exemplary rotary electrical connection module in accordance with another aspect of the present invention.

DETAILED DESCRIPTION OF THE INVENTION

Figure 1:
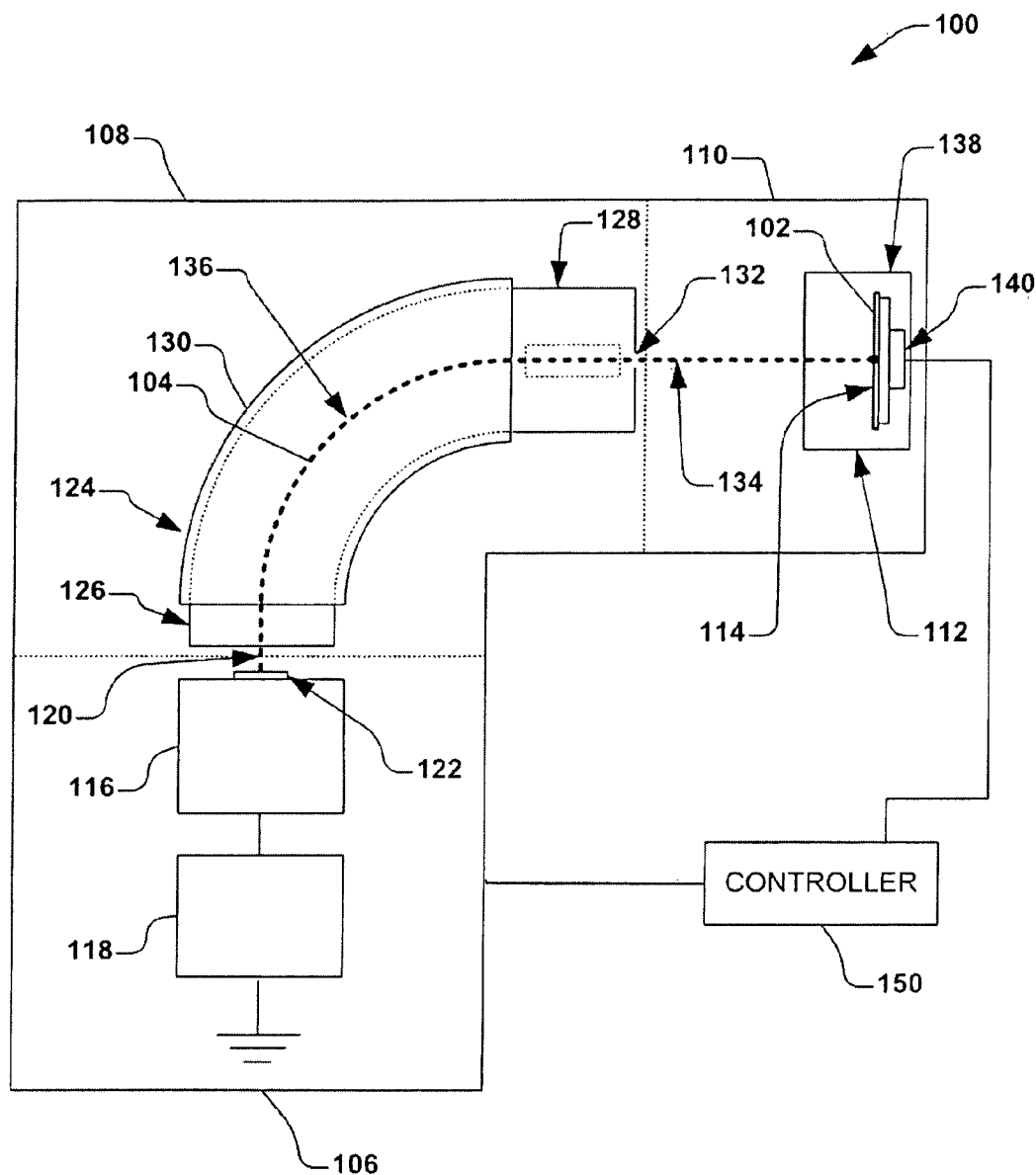
FIG. 1 illustrates an exemplary ion implantation system in accordance with one aspect of the present invention.

The present invention is directed generally toward an end effector for a scan arm, and more particularly, to a rotatable electrostatic chuck that is easily removable from the scan arm. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, in accordance with one exemplary aspect of the present invention, FIG. 1 illustrates an exemplary ion implantation system 100, wherein the ion implantation system is operable to scan a workpiece 102 (e.g., a semiconductor substrate or wafer) relative to an ion beam 104, therein implanting ions into the workpiece. As stated above, various aspects of the present invention may be implemented in association with any type of ion implantation apparatus, including, but not limited to the exemplary system 100 of FIG. 1. The exemplary ion implantation system 100 comprises a terminal 106, a beamline assembly 108, and an end station 110 that generally forms a process chamber 112, wherein the ion beam 104 is generally directed at the workpiece 102 positioned at a workpiece location 114. An ion source 116 in the terminal 106 is powered by a power supply 118 to provide an extracted ion beam 120 (e.g., an undifferentiated ion beam) to the beamline assembly 108, wherein the ion source comprises one or more extraction electrodes 122 to extract ions from the source chamber and thereby to direct the extracted ion beam toward the beamline assembly 108.

The beamline assembly 108, for example, comprises a beamguide 124 having an entrance 126 proximate to the source 116 and an exit 128 proximate to the end station 110. The beamguide 124, for example, comprises a mass analyzer 130 (e.g., a mass analysis magnet) that receives the extracted ion beam 120 and creates a dipole magnetic field to pass only ions of appropriate energy-to-mass ratio or range thereof through a resolving aperture 132 to the workpiece 102. The ions passed through the mass analyzer 130 and exit the resolving aperture 132 generally define a mass analyzed or desired ion beam 134 having ions of the desired energy-to-mass ratio or range thereof. Various beam forming and shaping structures (not shown) associated with the beamline assembly 108 may be further provided to maintain and bound the ion beam 104 when the ion beam is transported along a desired beam path 136 to the workpiece 102.

In one example, the desired ion beam 134 is directed toward the workpiece 102, wherein the workpiece is generally positioned via a workpiece scanning system 138 associated with the end station 110. The end station 110 illustrated in FIG. 1, for example, may comprise a "serial" type end station that provides a mechanical scanning of the workpiece within the evacuated process chamber 112, in which the workpiece 102 (e.g., a semiconductor wafer, display panel, or other workpiece) is mechanically translated through the beam path 136 in one or more directions via a workpiece scanning system 138. According to one exemplary aspect of the present invention, the ion implantation system 100 provides the desired ion beam 134 (e.g., also referred to as a "spot beam" or "pencil beam") as being generally stationary, wherein the workpiece scanning system 138 generally translates the workpiece 102 in two generally orthogonal axes with respect to the stationary ion beam. It should be noted, however, that batch or other type end stations may alternatively be employed, wherein multiple workpieces 102 may be scanned simultaneously, and such end stations are contemplated as falling within the scope of the present invention. In another example, the system 100 may comprise an electrostatic beam scanning system (not shown) operable to scan the ion beam 104 along one or more scan planes relative to the workpiece 102. Accordingly, the present invention further contemplates any scanned or non-scanned ion beam 104 as falling within the scope of the present invention. According to one exemplary aspect of the invention, the ion implantation system 100 may comprise the ion implantation system and scanning apparatus described in commonly-owned U.S. Pat. No. 7,135,691 to Vanderpot et al., the contents of which are hereby incorporated by reference. Further, the ion implantation system 100 may comprise other systems such as the Optima HD Scan System manufactured by Axcelis Technologies of Beverly, Mass.

In accordance with a preferred embodiment of the present invention, the workpiece scanning system 138 of FIG. 1 comprises a scan arm 140, wherein the scan arm is configured to reciprocally scan the workpiece 102 with respect to the ion beam 104. The ion implantation system 100, for example, is further controlled by a controller 150, wherein functionality of the ion implantation system and workpiece scanning system 138 is controlled via the controller.

Figure 3:
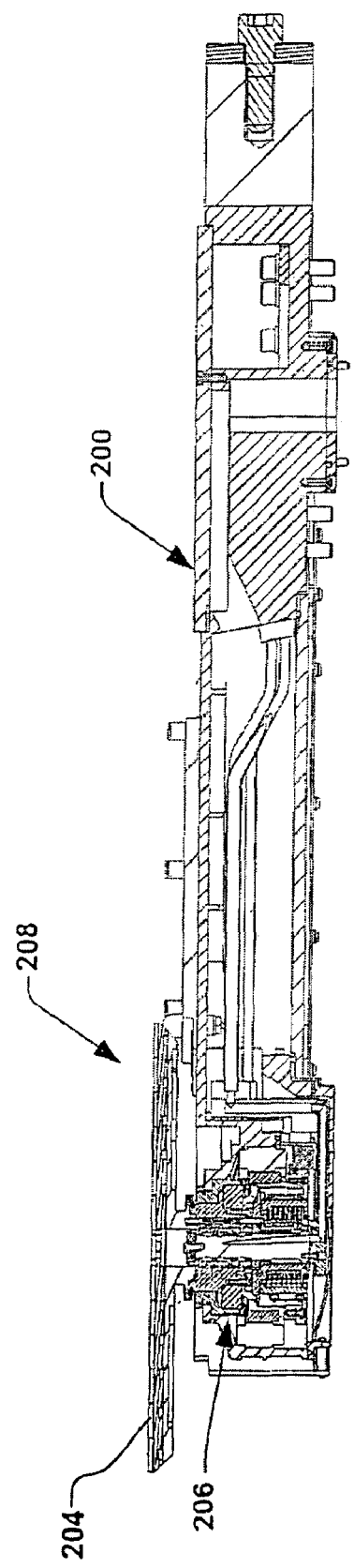
FIG. 3 illustrates a cross-sectional view of an exemplary scan arm according to another aspect of the present invention.

FIGS. 2A and 2B illustrate respective top and bottom plan views of an exemplary scan arm 200, wherein the scan arm comprises an end effector 202 associated with the workpiece 102 of FIG. 1. The end effector 202 of FIGS. 2A and 2B, for example, comprises an electrostatic chuck (ESC) 204. In the present example, the end effector 202 comprises a twist head 206 illustrated in FIG. 2B that is operably coupled to an end 208 of the scan arm 200, wherein the twist head is operable to rotate the ESC 204 relative to the scan arm about a twist axis 210. The scan arm 200 in the present example is operable to further rotate about an arm axis 212, thus translating the end effector 202 in a generally arcuate path 214. The ESC 204 of the present invention is further operable to be easily removed from the twist head 206 without a disassembly of various dynamic seals, as will be discussed infra. For example, FIG. 3 illustrates a cross-sectional view of the scan arm 200 in accordance with one exemplary aspect of the invention, wherein various advantages of the present invention over conventional rotational ESCs are provided by coupling the ESC 204 to the scan arm 200 in an easily-removable manner. Accordingly, the present invention overcomes various electrical and fluid connection problems seen in the prior art.

Figure 4:
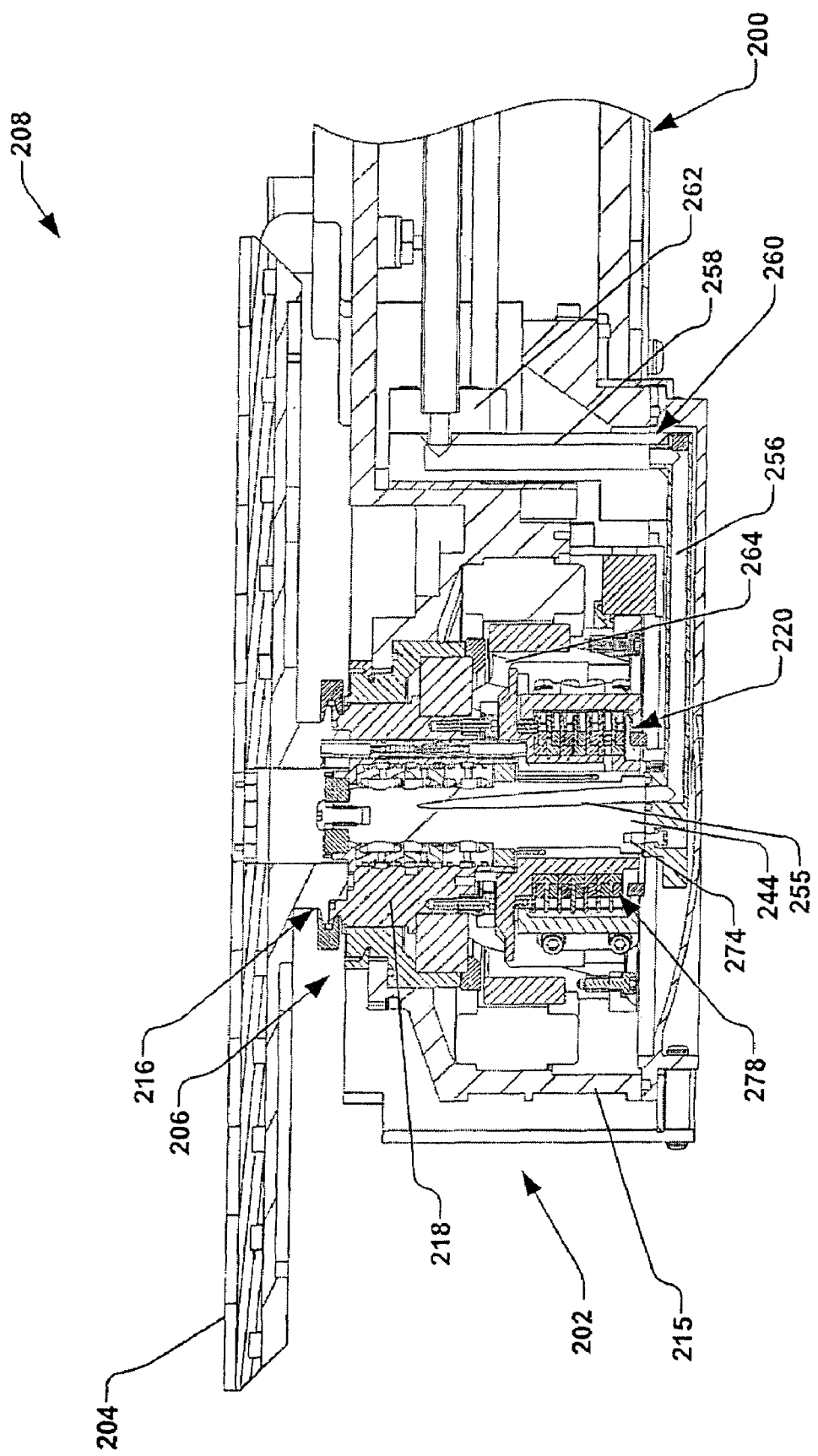
FIG. 4 illustrates a partial cross-sectional view of an exemplary twist arm in accordance with still another aspect of the invention.

FIG. 4 illustrates an enlarged view of the end 208 of the scan arm 200 of FIG. 3, wherein various features are illustrated in greater detail. For example, the twist head 206 comprises an enclosure 215 that is generally fixed with respect to the scan arm 200. A wedge mount 216 is further provided, wherein the wedge mount operably couples the ESC 204 to a rotatable shaft 218 of the twist head 206. The rotatable shaft 218 is operable to rotate with respect to the enclosure 215 of the twist head 206, as will be discussed infra. The wedge mount 216, for example, is comprised of a first mounting member 219A coupled to the ESC 204 and a second mounting member 219B coupled to the rotatable shaft 218, as will also be discussed infra.

Figure 5:
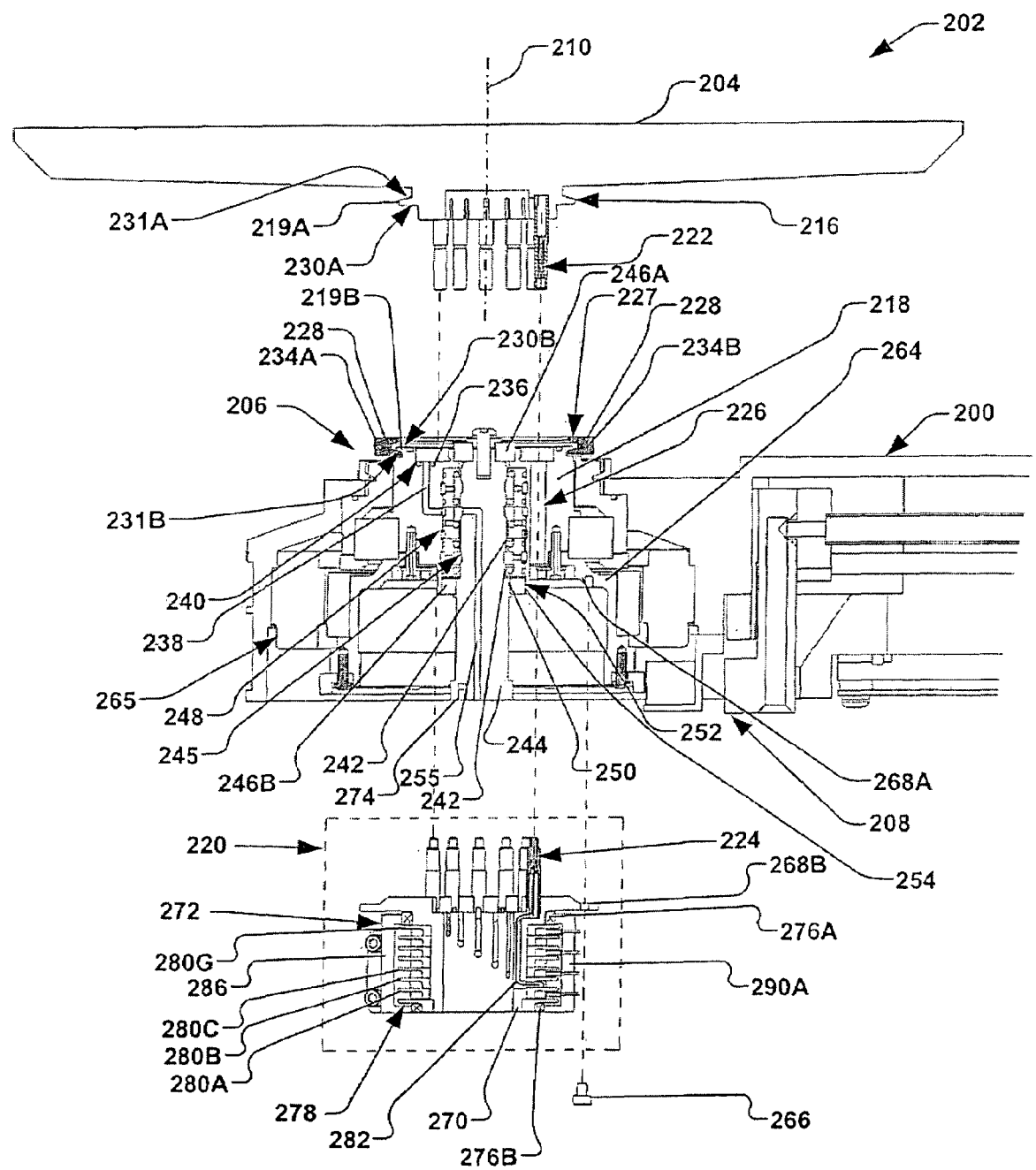
FIG. 5 illustrates a blown-up partial cross-sectional view of an exemplary twist arm in accordance with yet another aspect of the invention.

The end effector 202 is further illustrated in a blown-up view in FIG. 5, wherein the end effector further comprises a rotary electrical connection module 220 (also called an "RECM"). One or more ESC connector pins 222 (e.g., first electrical connectors) are associated with the ESC 204 for providing electrical connections to one or more rotary electrical connection module pins 224 (e.g., second electrical connectors, also called "RECM pins") associated with the RECM. In the present example, the ESC connector pins 222 and RECM pins 224 are operable to generally extend through one or more thru-holes 226 associated with the rotatable shaft 218. The ESC connector pins 222 and RECM pins 224 are further operable to mate with each other when inserted into the thru holes 226, thus electrically coupling the ESC 204 with the twist head 206 of the end effector 202. It should be noted that the ESC connector pins 222 and RECM pins 224 (e.g., the first and second electrical connectors) may comprise any mating electrical connection between the ESC 204 and the RECM 220, and are not limited to pins. For example, spade connectors (not shown) or other electrical connectors may be utilized in accordance with the present invention.

In accordance with the invention, the ESC 204 is selectably mounted to the twist head 206 by a clamping member 227. In the present example, the ESC 204 is selectably mounted to the rotatable shaft 218 via a K-clamp 228, wherein the K-clamp is operable to compress mating surfaces 230A and 230B of the respective first mounting member 219A of the ESC and the second mounting member 219B of the rotatable shaft axially together by external wedging action against a first clamp engagement surface 231A of the first mounting member and a second clamp engagement surface 231B of the second mounting member. For example, FIG. 6 illustrates the K-clamp 228 comprising two half-circles 234A and 234B, wherein the screws 232 are operable to pull the half-circles together, thus compressing the mating surfaces 230A and 230B of the ESC 204 of FIGS. 4 and 5 and rotatable shaft 218 together. Thus, the ESC 204 can therefore be easily removed and remounted without disassembling dynamic seals, such as typically required by prior art end effectors. For example, internal mounting screws seen in conventional end effectors are absent, wherein access to an internal side of the rotatable shaft is not needed for removing or remounting the conventional ESC to the conventional end effector.

According to another aspect of the invention, one or more static o-ring seals 236 illustrated in FIG. 5 connect one or more first fluid channels 237 (illustrated in FIG. 8B) associated with the ESC 204 to one or more second fluid channels 238 associated with the rotatable shaft 218 at a static interface 240 of FIG. 5. According to one example, dynamic lip seals 242 are further provided, wherein the rotatable shaft 218 is dynamically sealed to a non-rotating fluid core 244 at a dynamic interface 245. One or more concentricity control bearings 246A and 246B are further provided to control the axial position and concentricity of the fluid core 244 relative to a female bore 248 of the rotatable shaft 218. Concentricity control bearing 246A (the "upper bearing"), for example, provides both axial and radial constraint of the fluid core 244 relative to the rotatable shaft 218, while concentricity control bearing 246B (the "lower bearing") comprises an inner race 250 generally fixed with respect to the fluid core 244, but is still allowed to slide axially at an interface 252 of an outer race 254 of the lower bearing to the female bore 248 in the rotatable shaft. The fluid core 244 further comprises one or more third fluid channels 255 associated therewith, wherein fluid communication is permitted between the one or more second fluid channels 238 of the rotatable shaft 218 and the one or more third fluid channels of the fluid core via the one or more dynamic lip seals 242 disposed at the dynamic interface 245.

According to another example, the fluid core 244 is further operably coupled to a first fluid line block 256 associated with the scan arm 200 illustrated in FIG. 4, wherein the first fluid line block is further coupled to a second fluid line block 258. The second fluid line block 258, for example, is designed to have compliance associated therewith, wherein radial forces on the fluid core 244 are advantageously minimized during translation of the fluid core and first fluid line block. For example, a lower portion 260 of the second fluid line block 258 is generally cantilevered from a substantially rigid fluid coupling 262 associated with the scan arm 200, such that the compliance associated with the lower portion 260 of the second fluid line block generally mitigates the radial forces on the fluid core 244. Such translation of the fluid core 244 and first fluid line block 256, for example, may be caused by an eccentricity of the concentricity control bearings 246A and 246B as the rotatable shaft 218 of the twist head 206 is rotated.

As illustrated in FIGS. 4 and 5, the rotary electrical connection module 220 is operably coupled to a motor rotor holder 264 for operably coupling the RECM to a motor 265 via screws 266 (illustrated in FIG. 5) in a mounting flange 268A, 268B associated therewith, wherein the RECM can be removed and remounted via axial motion without removing the fluid core 244. The mounting flange 268B, for example, is operably coupled to a rotating inner cylinder 270 of the RECM 220, wherein a non-rotating enclosure 272 of the RECM is generally prevented from rotating via an anti-rotation pin 274 coupled to the first fluid line block 256 of FIG. 4. The RECM 220, for example, comprises internal bearings 276A, 276B, wherein the internal bearing generally maintain concentricity between the rotating inner cylinder 270 and the non-rotating enclosure 272.

In accordance with another exemplary aspect, the RECM 220 comprises a slip ring stack 278, wherein coaxial slip rings 280A . . . 280G (e.g., seven coaxial slip rings are provided in the present example, however any number of slip rings are contemplated) are coupled to the rotating inner cylinder 270. The mounting flange 268B, in one example, is integral to the rotating inner cylinder 270, and the RECM pins 224 are coupled to the mounting flange in the appropriate positions to penetrate the thru holes 226 in the rotatable shaft 218 of the twist head 206. A wire 282, for example, is further routed from each RECM pin 224 to a corresponding slip ring 280.

The rotating inner cylinder 270, for example, comprises two half-pipes 286A and 286B associated therewith, as further illustrated in FIGS. 7A-7B in plan and side views, wherein the two half-pipes are bolted to one another around the bearings 276A and 276B of FIG. 5 to form the enclosure 272 concentric with the rotating inner cylinder. The half-pipes 286A and 286B, for example, further comprise brush blocks 290. One brush block 290A, for example, as illustrated in FIGS. 5 and 7A-7B, is operably coupled to four dual-leaf contact brushes, and the other brush block 290B illustrated in FIGS. 7A-7B is operably coupled to three brushes. Brush blocks 290A-290B, for example, are designed such that the respective brushes are respectively operable to contact every other coaxial slip ring 280A-280G on the slip ring stack 278 of FIG. 5. The brush blocks 290 are generally mounted in slots (not shown) in the half pipes 286, such that each slip ring 280A-280G is in contact with one brush, therein providing two contact points for each slip ring.

Figure 8B:
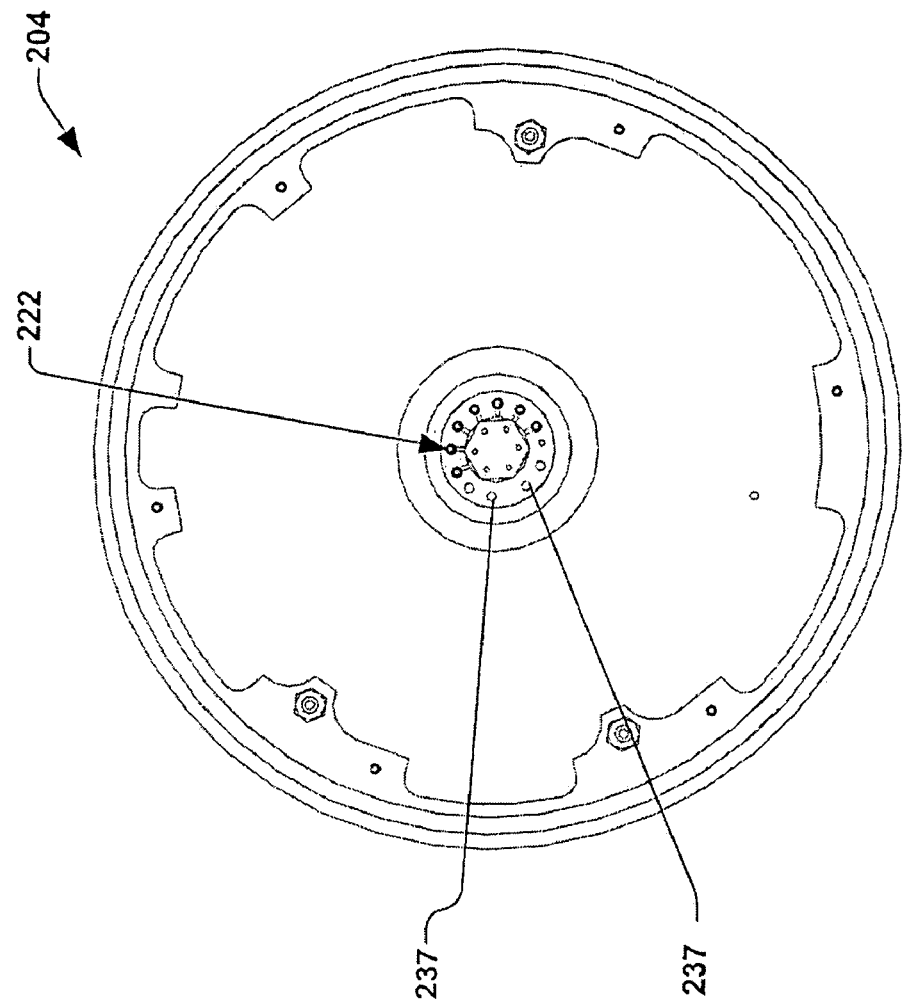
FIGS. 8A-8B illustrate an exemplary electrostatic chuck in accordance with yet another aspect of the present invention.
Figure 8A:
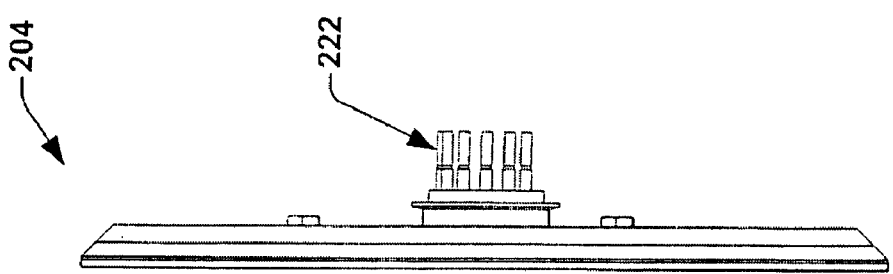

FIGS. 8A and 8B illustrate side and plan views of the exemplary ESC 204, wherein the ESC connector pins 222 are illustrated, as well as the one or more first fluid channel 237. The one or more first fluid channels 237, for example, are configured to couple with the one or more second fluid channels 238 of the twist head 206 of FIG. 5 via the static o-rings seals 236, and the ESC connector pins 222 are configured to with RECM pins 224, such that the removal of the ESC 204 from the twist head 206 does not compromise dynamic fluid seals, and such that ease of maintenance of the ESC is significantly greater than that seen in the prior art.

The present invention further contemplates a continuous rotation or counter rotation of the scan arm 200 of FIGS. 2-5, in one example, wherein one or more of the scan arm and twist head 206 are operable to continuously rotate beyond 360 degrees. Further, the rotary drive of the twist head 206 advantageously provides an ease of maintenance and/or removal and/or replacement of the ESC via the integrated electrical connections, fluid connections and passageways, wedge-action K-clamp 228, and mating rotary drive associated with the twist head.

Figure 9:
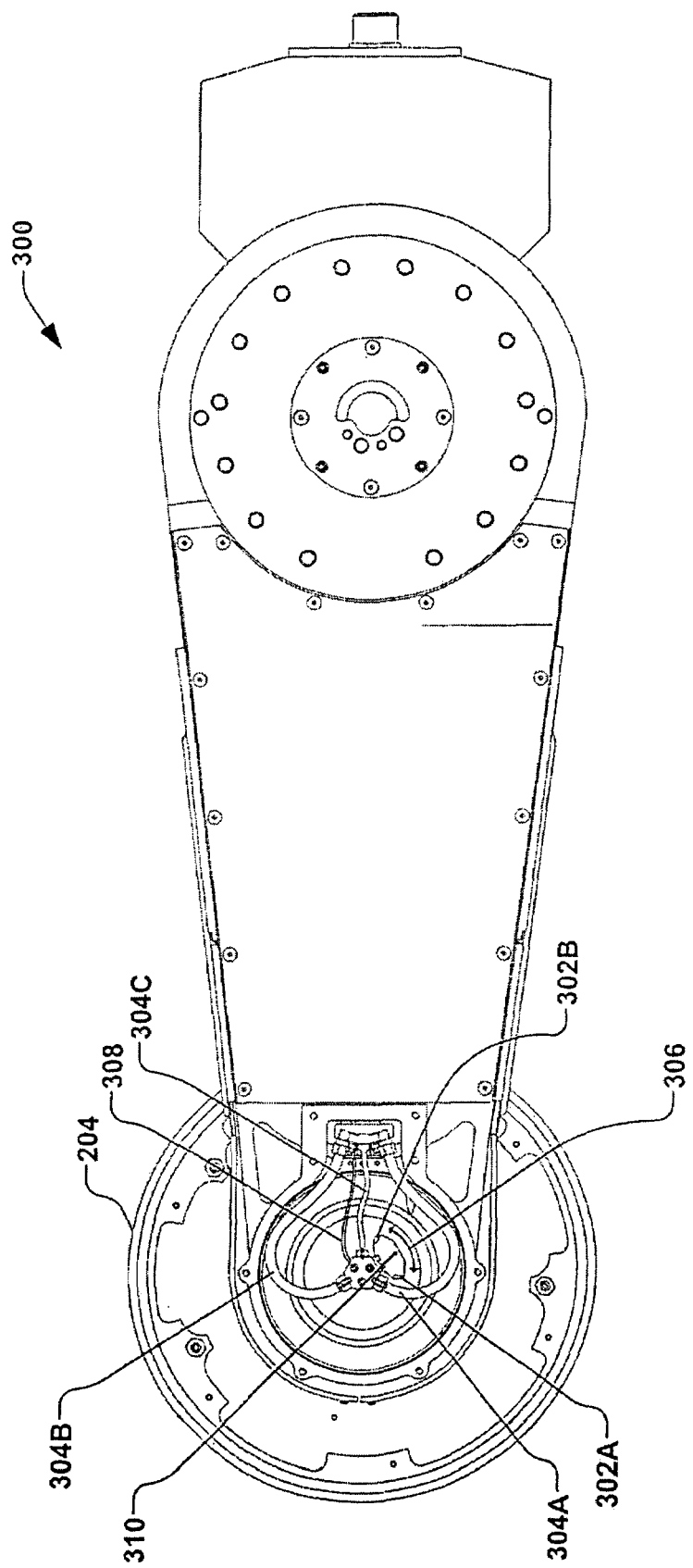
FIG. 9 illustrates another exemplary scan arm according to still another aspect of the invention.

In accordance with another exemplary aspect of the present invention, a scan arm 300 is illustrated in FIG. 9, wherein the scan arm 300 is substantially similar to the scan arm 200 of FIGS. 2-5, with an additional novel aspect of the invention; namely, an addition of rotation-limiting hard-stop brackets 302A-302B that generally permit a partial rotation of the rotatable shaft 218 and fluid core 244 of FIG. 5 with respect to the scan arm 200. The scan arm 300 of FIG. 8, in the present example, comprises one or more flexible fluid lines 304A-304C coupled to one or more of the first fluid line block 256 and second fluid line block 258 of FIG. 4, wherein the flexible fluid lines, in conjunction with the hard-stop brackets 302A-302B generally permit a predetermined rotation 306 (e.g., 30 degrees in either rotational direction), wherein the rotatable shaft 218 is generally stationary relative to the dynamic lip seals 242 of FIG. 5 during the predetermined rotation (e.g., due to static friction between the lips seals and the shaft). Beyond the predetermined rotation 306, the fluid core 244 will stop rotating relative to the scan arm 300, and the lip seals 242 will begin to slide relative to the rotatable shaft 218. Such an allowance for rotation of the rotatable shaft 218 and lip seals 242 together, for example, allows for increased cycle life of the lip seals.

According to another example, a flexible electrical connection 308 (e.g., a flexible cable or flexible ribbon) coupled to the ESC 204 and the scan arm 300 further allows the predetermined rotation 306. For example, the flexible electrical connection 308 provides an electrical connection between the scan arm 300 and the half pipe 286B of FIGS. 5 and 7A-7B. In the present example, the fluid core 244 of FIG. 5 is further fixedly coupled to the half pipe 286 and the hard stop brackets 302A-302B by a pin 310 illustrated in FIG. 9, wherein the fluid core 244 is further generally permitted to rotate by the predetermined rotation 306, and wherein the rotatable shaft 218 is permitted to rotate relative to the slip rings 280A-280G beyond the predetermined rotation. The predetermined rotation 306, for example, is selected such that wear on the flexible fluid lines 304 and flexible electrical connection 308 is minimized. Thus, for relatively small rotational oscillations of the scan arm 300 (e.g., under 30 degrees of rotation), the lip seals 242 of FIG. 5 act as static seals, thus increasing a life expectancy of the scanning mechanism. In one alternative, the hard stop brackets 302A-302B may be omitted, wherein the one or more flexible fluid lines 304A-304C and/or the flexible electrical connection 308 generally provide the predetermined rotation 306, wherein an extension of the one or more flexible fluid lines and/or the flexible electrical connection limits the rotation.

Figure 10:
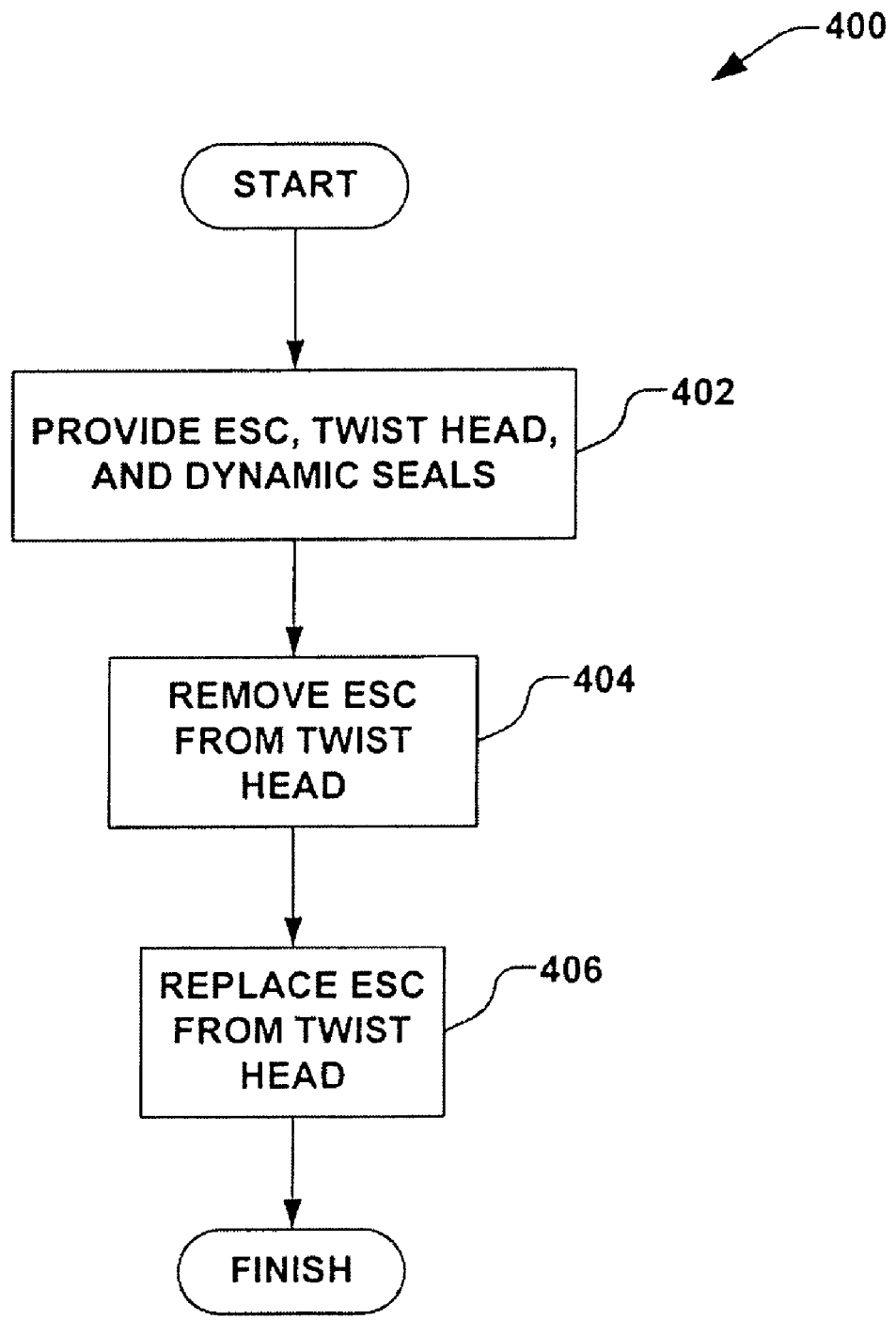
FIG. 10 is a block diagram of an exemplary method for maintaining a scan arm according to another exemplary aspect of the invention.

In accordance with still another aspect of the present invention, a method for removing an ESC from a scan arm is provided in FIG. 10. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 5, the method 400 begins with providing an electrostatic chuck, a twist head, and one or more dynamic fluid seals between the electrostatic chuck and twist head in act 402. In act 404, the electrostatic chuck is removed from the twist head without disconnecting the one or more dynamic fluid seals. Such a disconnection can be accomplished by any of the structures described herein. In act 406, the electrostatic chuck is attached to the twist head.

It should be noted that although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A rotational end effector for a scan arm, the rotational end effector comprising:
    an electrostatic chuck comprising a first mounting member, wherein the first mounting member has one or more first electrical connectors and one or more first fluid channels associated therewith;
    a twist head, wherein the twist head is configured to selectively rotate the electrostatic chuck about a twist axis, the twist head comprising:
        a generally fixed enclosure; and
        a rotatable shaft rotatably coupled to the enclosure, wherein the rotatable shaft comprises a second mounting member, and wherein the rotatable shaft has one or more second electrical connectors and one or more second fluid channels associated therewith; and
    a clamping member, wherein the clamping member is configured to selectively couple the first mounting member of the electrostatic chuck to the second mounting member of the rotatable shaft, wherein the one or more first electrical connectors and the one or more first fluid channels of the electrostatic chuck are selectively connected to the respective one or more second electrical connectors and one or more second fluid channels of the rotatable shaft by the clamping member.

2. The rotational end effector of claim 1, wherein the first mounting member comprises a first mounting surface and a first clamp engagement surface, and wherein the second mounting member comprises a second mounting surface and a second clamp engagement surface, wherein the clamping member is configured to selectively compress the first mounting surface against the second mounting surface by and engagement of the clamping member with the first clamp engagement surface and second clamp engagement surface.

3. The rotational end effector of claim 1, wherein the clamping member comprises a K-clamp.

4. The rotational end effector of claim 1, wherein the twist head further comprises a motor operably coupled to the rotatable shaft, wherein the motor is configured to selectively rotate the electrostatic chuck with respect to the generally fixed enclosure.

5. The rotational end effector of claim 4, wherein the rotatable shaft comprises one or more thru-holes associated therewith, wherein the one or more first electrical connectors comprise one or more electrostatic chuck connector pins, and wherein the twist head further comprises a rotary electrical connection module, wherein the one or more second electrical connectors comprise one or more rotary electrical connection module pins, wherein the one or more electrostatic chuck connector pins and one or more electrical connection module pins are operable to generally extend through one or more thru-holes and respectively mate with one another.

6. The rotational end effector of claim 5, wherein the rotary electrical connection module comprises a rotating inner cylinder and a non-rotating enclosure selectably coupled to the motor, wherein the rotary electrical connection module further comprises one or more slip rings operably coupled to the rotating inner cylinder, and wherein the one or more slip rings are configured to electrically connect to the one or more rotary electrical connection module pins.

7. The rotational end effector of claim 6, wherein the rotating inner cylinder comprises a mounting flange, wherein the one or more rotary electrical connection module pins are coupled to the mounting flange, wherein the one or more rotary electrical connection module pins penetrate the one or more thru holes in the rotatable shaft.

8. The rotational end effector of claim 7, further comprising one or more wires electrically connecting the respective one or more rotary electrical connection module pins to the respective one or more slip rings.

9. The rotational end effector of claim 1, wherein the generally fixed enclosure further comprises a non-rotating fluid core having one or more third fluid channels associated therewith, wherein the non-rotating fluid core is fixed with respect to the generally fixed enclosure.

10. The rotational end effector of claim 9, further comprising one or more dynamic lip seals disposed at an interface between the one or more second fluid channels of the rotatable shaft and the one or more third fluid channels of the non-rotating fluid core.

11. The rotational end effector of claim 10, further comprising one or more static o-ring seals between the one or more first fluid channels of the electrostatic chuck and the one or more second fluid channels of the rotatable shaft.

12. The rotational end effector of claim 9, wherein the non-rotating fluid core is fixed with respect to the scan arm.

13. The rotational end effector of claim 1, wherein the generally fixed enclosure further comprises a fluid core having one or more third fluid channels associated therewith, and wherein the twist head further comprises one or more flexible fluid lines in respective fluid communication with the one or more third fluid channels of the fluid core and one or more fluid line blocks associated with the scan arm.

14. The rotational end effector of claim 13, further comprising a pair of rotation-limiting hard-stop brackets, wherein the pair of rotation-limiting hard-stop brackets generally defines a predetermined rotation of the fluid core with respect to the scan arm.

15. The rotational end effector of claim 14, wherein the predetermined rotation is approximately 60 degrees.

16. The rotational end effector of claim 14, wherein the rotatable shaft is generally stationary relative to dynamic lip seals within the predetermined rotation.

17. The rotational end effector of claim 1, further comprising one or more o-rings disposed between respective mating surfaces of the first mounting member and the second mounting member, wherein the one or more o-rings generally statically seal a one or more fluid junctions between the electrostatic chuck and the rotatable shaft.

18. The rotational end effector of claim 1, further comprising a rotary electrical connection module, wherein the one or more first electrical connectors members are configured to selectively engage the one or more second electrical connectors within the rotary electrical connection module.

19. The rotational end effector of claim 18, further comprising a non-rotating fluid core and at least one dynamic fluid seal between the rotatable shaft and the non-rotating fluid core, wherein the rotary electrical connection module comprises one or more slip rings associated with the rotatable shaft, and wherein the one or more second electrical connectors comprise one or more rotary electrical connection module mounting pins respectively associated with the respective one or more slip rings, wherein the one or more rotary electrical connection module mounting pins are operable to mate with the respective one or more first electrical connectors, and wherein electrical contact between the one or more rotary electrical connection module mounting pins and the one or more first electrical connectors is operable to be made or broken via an axial translation between the rotary electrical connection module and the electrostatic chuck along the twist axis of the rotatable shaft, wherein the at least one dynamic fluid seal is not broken during the axial translation of the rotary electrical connection module and the electrostatic chuck.

20. The rotational end effector of claim 19, further comprising:
   a plurality of bearings associated with the rotatable shaft and non-rotating fluid core; and
   a translationally compliant fluid channel segment associated with the non-rotating fluid core, wherein the plurality of bearings and fluid channel segment operable to maintain a concentricity of the rotatable shaft with respect to the non-rotating fluid core.

21. A scan arm twist head, comprising:
   at least one dynamic fluid seal;
   an electrostatic chuck having at least one electrical connection point associated therewith;
   a rotary electrical connection module having a rotating member;
   at least one slip ring associated with the rotating member of the rotary electrical connection module; and
   at least one mounting pin associated with the at least one slip ring of the rotary electrical connection module, the at least one mounting pin being operable to mate with the respective at least one connection point associated with an electrostatic chuck, and wherein electrical contact between the at least one mounting pin and the at least one connection point is operable to be made or broken via an axial translation between the rotary electrical connection module and the electrostatic chuck along an axis of rotation of the rotating member, wherein the at least one dynamic fluid seal is not broken during the axial translation of the rotary electrical connection module and the electrostatic chuck.

22. A rotational device for a scan arm, comprising:
   a non-rotating arm structure;
   a twist head;
   an intermediate structure;
   one or more rotary fluid connections; and
   one or more rotary electrical connections, wherein the one or more rotary fluid connections and one or more rotary electrical connections generally provide respective one or more fluid and electrical paths between the twist head and the intermediate structure, wherein fluid and electrical paths are further connected to the non-rotating arm structure via the one or more rotary fluid connections and one or more rotary electrical connections, therein generally permitting at least a partial rotation between the non-rotating arm structure and the twist head.

* * * * *